US006317303B1

(12) United States Patent
Zeigler et al.

(10) Patent No.: US 6,317,303 B1
(45) Date of Patent: Nov. 13, 2001

(54) HIGH-SPEED SUPERCONDUCTING PERSISTENT SWITCH

(75) Inventors: John C. Zeigler, Conroe; Scott D. Peck, The Woodlands, both of TX (US)

(73) Assignee: Houston Advanced Research Center, The Woodlands, TX (US)

( * ) Notice: Subject to any disclaimer, the term of this patent is extended or adjusted under 35 U.S.C. 154(b) by 0 days.

(21) Appl. No.: 09/402,429

(22) PCT Filed: Apr. 9, 1998

(86) PCT No.: PCT/US98/07067

§ 371 Date: Oct. 7, 1999

§ 102(e) Date: Oct. 7, 1999

(87) PCT Pub. No.: WO98/47186

PCT Pub. Date: Oct. 22, 1998

Related U.S. Application Data (60) Provisional application No. 60/043,791, filed on Apr. 11, 1997.

(51) Int. Cl.[7] ........................................ H02H 7/00
(52) U.S. Cl. .............................. 361/19; 361/115
(58) Field of Search ........................ 361/19, 115

(56) References Cited

U.S. PATENT DOCUMENTS 4,673,774 * 6/1987 Wake et al. ................... 174/94 R
4,752,654 * 6/1988 Iida et al. ...................... 174/128 S
5,680,085 * 10/1997 Aihara et al. .................. 335/216

FOREIGN PATENT DOCUMENTS 0 645 830 A1   3/1995  (EP) .................. H01L/39/20
2 162 712 A    2/1986  (GB) .................. H01L/39/16

OTHER PUBLICATIONS

Patent Abstracts of Japan, vol. 96, No. 2, abstract of JP 07 263760 of Oct. 13, 1995 (Feb. 29, 1996).

* cited by examiner

*Primary Examiner*—Stephen W. Jackson
(74) *Attorney, Agent, or Firm*—Anderson, Levine & Lintel (57) ABSTRACT

A superconducting magnetic energy storage system, including a superconducting persistent switch, is disclosed. The system includes a superconducting magnet connected in parallel with the persistent switch, both contained within a cryostat that is maintained at superconducting temperatures. Leads extending from the parallel connection of the magnet and switch are coupled to a power conditioning system, which in turn is coupled to a system load for which the system provides backup power. The disclosed persistent switch is fabricated as a wire having multiple superconducting strands within, and directly in contact with, an electrically conductive but non-superconducting stabilizer material. The persistent switch is normalized into a resistive state, to apply the stored energy to the load, by applying a rapid rise title current to the wire.

33 Claims, 5 Drawing Sheets

HIGH-SPEED SUPERCONDUCTING PERSISTENT SWITCH

CROSS-REFERENCE TO RELATED APPLICATIONS

This application claims priority of U.S. Provisional Application No. 60/043,791, filed Apr. 11, 1997.

STATEMENT REGARDING FEDERALLY SPONSORED RESEARCH OR DEVELOPMENT

Not applicable.

BACKGROUND OF THE INVENTION

This invention is in the field of persistent switches for superconducting systems.

Advances in the field of superconducting materials and systems have recently enabled the development of important applications of superconductors. One such application is commonly referred to in the art as superconducting magnetic energy storage, or SMES. SMES systems are being used to store energy for high-reliability electrical power systems, where loss of power to critical loads is to be avoided. In the event of a power loss, the SMES system extracts power from energy stored in the magnetic field generated by current conducted through a superconducting electromagnet, and rapidly provides this extracted power to the loads. Because the coil of the electromagnet is maintained in a superconducting state, no resistive losses are incurred in the magnet, allowing for efficient energy storage.

Figure 1:
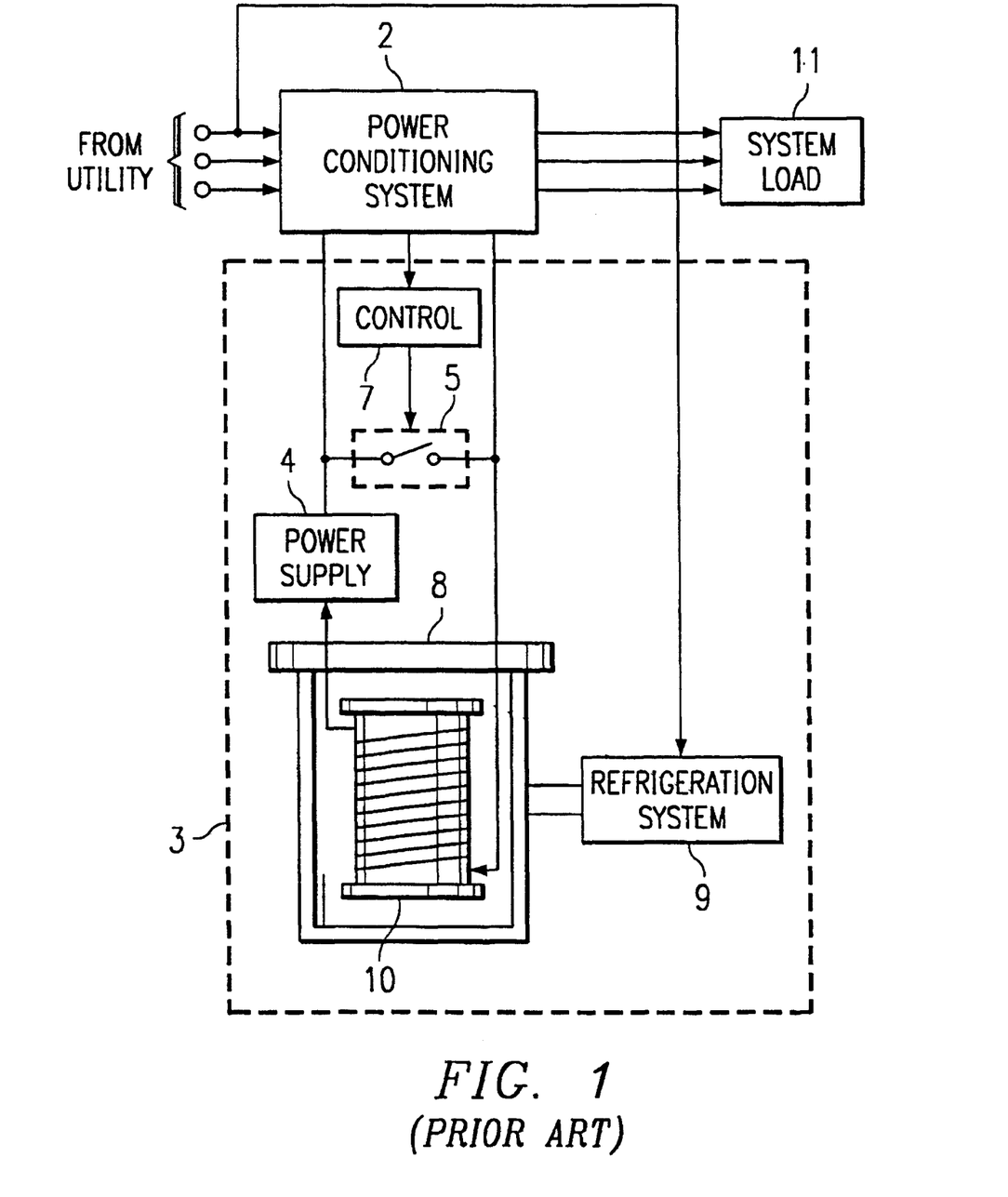
FIG. 1 is an electrical diagram, in block and schematic form, of a conventional superconducting magnetic energy storage system.

Referring now to FIG. 1, the construction and operation of conventional SMES system 3 for providing backup power to system load 11, by way of power conditioning system 2, will now be described. System load 11 includes the ultimate end use devices (computers, motors, lighting, and the like), and thus serves as the load to conventional SMES system 3. Power conditioning system 2 includes conventional circuitry, such as inverters and transformers, for receiving power from the utility and from SMES system 3, and for distributing, regulating, and applying the received power to system load 11 in the conventional fashion. In normal (i.e., non-failed) operation, system load 11 receives its power from the appropriate utility via conventional power conditioning system 2, as shown in FIG. 1; upon loss of power from the utility, system load 11 will receive temporary backup power from SMES system 3, also via power conditioning system 2.

Conventional SMES system 3 in FIG. 1 includes superconducting magnet 10, which is constructed in the conventional manner as a coil of superconducting wire maintained at superconducting temperatures by cryostat 8. Cryostat 8 is cooled by refrigeration system 9, which is typically powered by utility power. Magnet 10 is part of an electrical circuit that includes power supply 4 and switch 5, both of which are located outside of cryostat 8 in the usual manner. In conventional SMES systems, switch 5 is a solid-state high-current switch implemented by way of a room-temperature semiconductor device. Controller 7 is conventional circuitry that monitors the state of power received and distributed by power conditioning system 2, and that controls switch 5 accordingly.

In operation, magnet 10 is typically energized from power supply 4, with controller 7 maintaining switch 5 closed. Refrigeration system 9 has cooled cryostat 8 to superconducting temperatures by this time. The low impedance of switch 5 in its closed state, relative to the load of power conditioning system 2, keeps any substantial current from being shunted to power conditioning system 2 so long as switch 5 remains closed. The current circulating through magnet 10, which may be on the order of 1 kA, generates a sizable magnetic field which stores the backup energy. Power supply 4, connected in series with magnet 10 and switch 5, serves as a trickle supply to replace power lost by conduction of current through the non-superconducting portion of the magnet circuit (i.e., through switch 5 and the wires external to cryostat 8).

At such time as utility-fed power to power conditioning system 2 is lost, controller 7 senses this condition and opens switch 5. The energy stored in the magnetic field of magnet 10 is then automatically applied to power conditioning system 2 in the form of electrical current, since switch 5 is no longer shunting current from power conditioning system 2.

As noted above, conventional SMES system 3 utilizes a non-superconducting element as switch 5. As a result, significant energy is consumed by the system of FIG. 1, particularly in the replacement of energy by power supply 4 for the resistive losses in switch 5 and the connecting wires. Resistive energy losses are also incurred in room-temperature power supply 4 itself. In addition, because the circulating current is conducted outside of cryostat 8 in SMES system 3, the physical size of the conductors exiting cryostat 8 are quite large and thus conduct significant heat into cryostat 8; this addition of heat adds load to refrigeration system 9 in maintaining cryostat 8 at superconducting temperatures. These factors all add to the cost of operating conventional SMES system 3.

By way of further background, superconducting persistent switches are well known in the art. Persistent switches are typically lengths of superconducting material that can be selectably operated in the superconducting and resistive regions. As is fundamental in the art of superconductors, a superconducting material is in a superconducting state when operated within a window of permissible ranges of temperature, external magnetic field, and current. Persistent switches operate by changing either the temperature, current, or magnetic field of the superconducting material from within the superconductivity window to an operating point outside of the superconducting range, thus normalizing the material (i.e., switching its operation from superconducting to a resistive state).

Conventional persistent switches of the thermal type operate by heating the superconducting material to a temperature above its superconducting critical temperature. One known thermal persistent switch includes a resistive wire wound about the superconducting wire; normalization of the superconducting material is effected by applying a DC current to the resistive wire, heating the superconducting material to above its critical temperature. In these conventional persistent switches, the resistive wire must of course be electrically insulated from the superconducting wire. However, because electrical insulating materials are also generally thermally insulating, the efficiency and speed with which the superconducting wire can be heated in these switches is damped by the electrical insulator. As such, conventional thermally-switched persistent switches do not have sufficiently rapid switching times for many applications, such as SMES systems.

A second type of persistent switch injects an overcurrent into the superconducting material, raising the current conducted thereby to a level above the maximum permitted for superconductivity. The injected current also may induce some amount of eddy current heating in the superconducting wire, which assists normalization of the material. However, overcurrent persistent switches generally require the use of large external power supplies to provide the overcurrent, particularly when the operating current of the superconducting persistent switch is significantly less than the superconducting threshold current, as is typically the case. The cost and complexity of implementing overcurrent mode persistent switches is thus significant, particularly in fast switching applications such as SMES systems.

Magnetically-actuated persistent switches are also known in the art. These switches include an external coil, or electromagnet, for generating a sufficiently high magnetic field to normalize the superconducting material. Of course, both the external coil (of significant size) and driving circuitry must be provided for such switches, increasing the cost and implementation space therefor. In addition, particularly in cases where the operating magnetic field is much below the critical field limit, the size of the external coil can increase to a point at which its response is slow, slowing the switching speed of the persistent switch to a point at which it is not useful for SMES and other fast switching speed applications.

BRIEF SUMMARY OF THE INVENTION

It is therefore an object of the present invention to provide a superconducting persistent switch having a switching time that is sufficiently fast to be useful in emergency backup power applications.

It is a further object of the present invention to provide such a switch that may be housed in the same cryostat as the superconducting magnet.

It is a further object of the present invention to provide such a switch that is suitable for use in high current (e.g., kiloampere) applications.

It is a further object of the present invention to provide a backup power system incorporating such a persistent switch.

Other objects and advantages of the present invention will be apparent to those of ordinary skill in the art having reference to the following specification together with its drawings.

The persistent switch may be implemented as a length of superconducting wire, preferably in the form of one or more superconducting strands of wire within non-superconducting, but electrically and thermally conductive, stabilizing material. The superconducting wire is switched into the resistive region by injecting a current with a very rapid rise time into the switch; the injected current may be either a high-frequency sinusoidal current such as from a radio frequency (RF) generator, or a single pulse, such as from a precharged capacitor. In the RF case, the skin effect causes the high-frequency current to be conducted substantially at the surface of the wire and thus within the stabilizing material, causing resistive heating in the wire that is directly conducted to the superconductor, heating the superconductor to above its critical temperature, and normalizing the persistent switch into the resistive region. In the pulse case, the injected current gives rise to a redistribution of magnetic flux across the super-conducting wire cross-section. This flux redistribution, which manifests an apparent resistance in the superconducting wire, causes localized heating of the superconducting filaments to a temperature above the critical temperature, normalizing the persistent switch into the resistive region.

The switch may also be implemented into a backup power system of the SMES (Superconducting Magnetic Energy Storage) type, in which the persistent switch is included within the same cryostat as the magnet itself, and connected in parallel therewith. Normalization of the persistent switch, by applying a rapid rise time current to the switch, directs current from out of the magnet into the power conditioning system as backup power. The switching time of the persistent switch is sufficiently fast to maintain the power levels in the system load for sufficient time to permit backup generators or other long-term backup systems to begin operation.

DETAILED DESCRIPTION OF THE INVENTION

Figure 2:
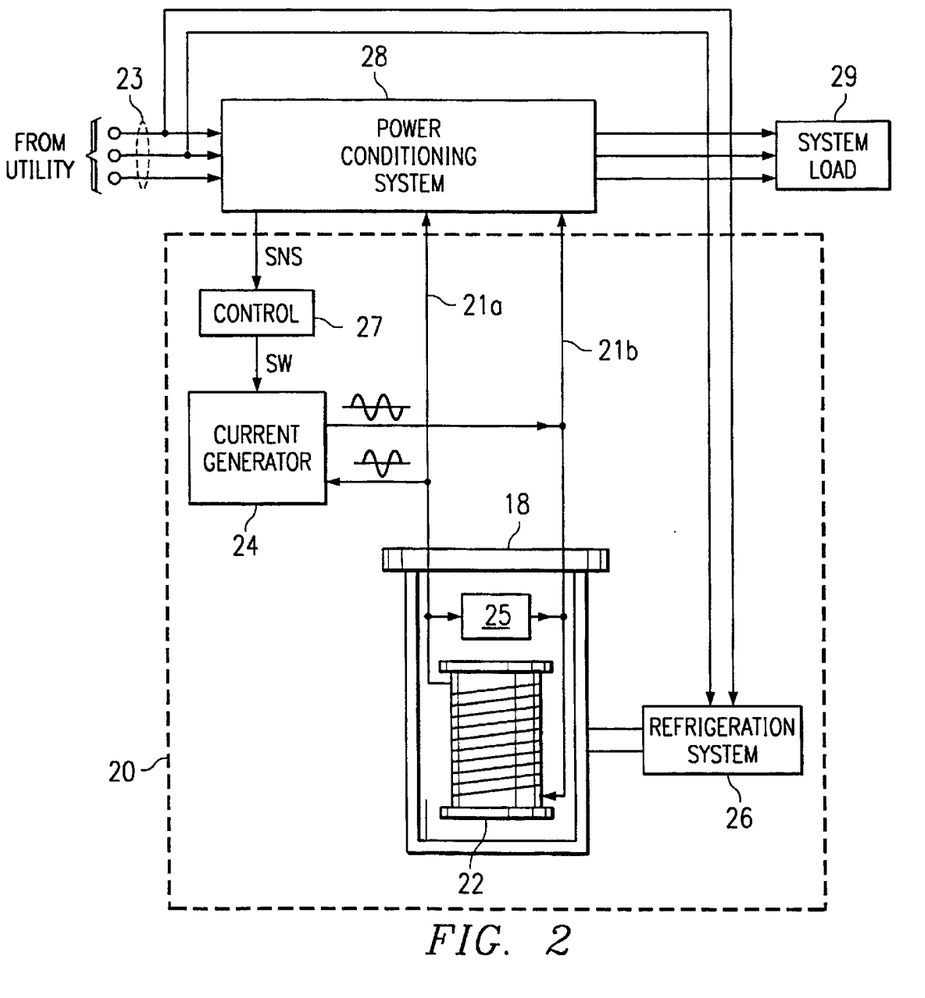
FIG. 2 is an electrical diagram, in block and schematic form, of a superconducting magnetic energy storage system according to the preferred embodiment of the invention.

Referring first to FIG. 2, energy storage system 20, of the superconducting magnetic energy storage (SMES) type, and constructed according to the preferred embodiment of the invention, will now be described. As illustrated in FIG. 2, energy storage system 20 is connected to power conditioning system 28 by way of leads 21a, 21b. Power conditioning system 28, as in the case of power conditioning system 2 in FIG. 1 described hereinabove, is conventional circuitry, such as inverters, transformers, and distribution and power regulation elements, for receiving power in normal operation from a utility on lines 23, and for routing the appropriate power to the system components comprising system load 29, in the conventional manner. System load 29 includes end use components, such as computers, motors, and the like. The combination of power conditioning system 28 and system load 29 thus serves as the load to energy storage system 20.

Energy storage system 20 includes cryostat 18, which is a conventional insulated container for maintaining very low temperatures, such as 20 kelvins or lower, as necessary to maintain superconducting materials in their superconducting state; refrigeration system 26 is a conventional refrigeration unit, powered from power conditioning system 28, for cooling cryostat 18 to such temperatures. Superconducting magnet 22 is located within cryostat 18, and is constructed in the conventional manner for SMES systems as a coil of superconducting wire surrounding an iron or non-ferromagnetic bore, as desired. The superconducting wire in magnet 22 is preferably of such size as to carry 1 kA or more current, and has sufficient turns (e.g., on the order of one thousand turns) so as to store the desired amount of energy for use as backup power to power conditioning system 28. For example, energy equivalent to 750 kW of power for two seconds of carry-through to power conditioning system 28 may be stored by magnet 22.

Connected in parallel with magnet 22, and located within cryostat 18, is persistent switch 25, the construction of which will be described in further detail hereinbelow. Persistent switch 25 and magnet 22 are connected in parallel with one another, and to leads 21a, 21b that are forwarded to power conditioning system 28. Persistent switch 25, as will be described in further detail hereinbelow, is constructed of superconducting material in such a manner as to be selectively normalized by the application of a rapid rise-time current to leads 21a, 21b. When in its superconducting state, persistent switch 25 shunts the current conducted by magnet 22, preventing the current from exiting cryostat 18 and being drawn by power conditioning system 28 via leads 21a, 21b; when resistive, persistent switch 25 presents a greater impedance to magnet 22 than power conditioning system 28, in which case the current conducted by magnet 22 will be applied to power conditioning system 28.

Energy storage system 20, according to this preferred embodiment of the invention, further includes controller 27 and current generator 24. Controller 27 receives a sense signal on line SNS from power conditioning system 28, and applies a switch signal on line SW to current generator 24. Controller 27 is thus of conventional construction for backup power systems, for sensing loss of power as indicated on line SNS and for effecting a switch signal on line SW in response thereto. As will be described in further detail hereinbelow, this rapid rise time current causes persistent switch 25 in cryostat 18 to normalize, switching from superconducting operation to its resistive region, and thus directing current conducted by magnet 22 to power conditioning system 28.

According to the preferred embodiment of the invention, current generator 24 generates a rapid rise time current to leads 21a, 21b in response to receiving a switch signal on line SW from controller 27. According to the present invention, this rapid rise time current may be applied in various forms. One contemplated form of the rapid rise time current is a high frequency current, for example in the radio frequency (RF) band, in which case current generator 24 is a conventional RF generator. An alternative form of the rapid rise time current that is also contemplated according to the present invention is a non-periodic pulse, such as one half-cycle of a sinusoid, which has a sufficiently fast rise time to cause normalization of persistent switch 25; in this form, the sinusoid (if extrapolated to multiple cycles) preferably has a "frequency" that is somewhat below the RF band. In this alternative case, current generator 24 may be implemented as a capacitor, inductor, and switch, with the switch applying the capacitor plate voltage to the inductor in series with leads 21a, 21b so as to discharge the capacitor through persistent switch 25.

Figure 3:
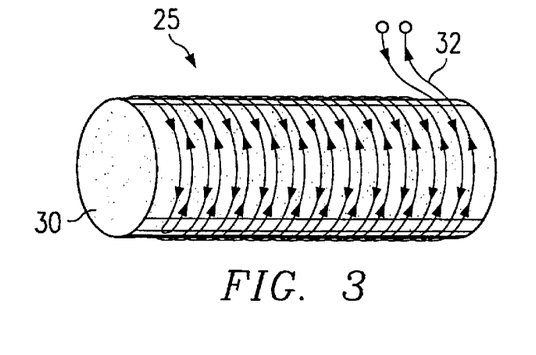
FIG. 3 is a perspective view of a persistent switch according to a first embodiment of the invention.

Referring now to FIG. 3, the construction of persistent switch 25 according to a first embodiment of the invention will now be described in detail. Persistent switch 25 according to this first embodiment of the invention is constructed from stabilized superconducting wire 32 wound in bifilar fashion around coil former 30. Coil former 30 is preferably a non-conductive, non-ferromagnetic material, such as fiberglass epoxy, having the desired cross-sectional shape and size. In this example, coil former 30 is cylindrical in shape. Of course, other alternative materials may be used for coil former 30; in addition, coil formers may be temporarily used merely in the winding of wire 32 into shape, and then removed.

Figure 4:
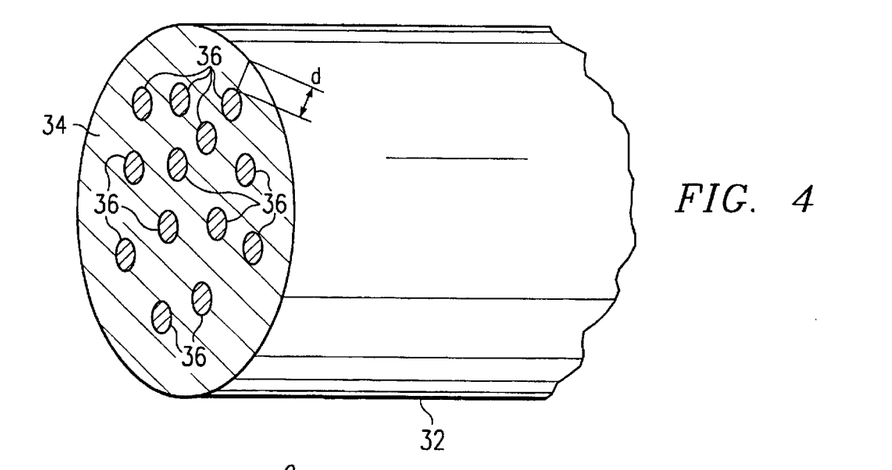
FIG. 4 is a cross-sectional view of the wire in the persistent switch of FIG. 3.

As noted above, wire 32 is preferably fabricated of superconducting material with a non-superconducting stabilizer. Referring now to FIG. 4, wire 32 according to the preferred embodiments of the invention is illustrated in cross-section. Wire 32 includes multiple strands 36 of superconducting material, such as niobium titanium alloys and other known superconducting alloys, disposed within and surrounded by copper-nickel stabilizer 34. While other materials may be used as stabilizer 34 in wire 32, copper-nickel stabilizer 34 is preferred as it is relatively resistive as compared with pure copper and other stabilizer materials. Wire 32 is constructed by conventional techniques, such as extrusion, so as to have strands 36 embedded within stabilizer 34. An example of wire 32 has an overall diameter of on the order of 1 mm, made up of eighteen strands 36 of superconducting material, each with a diameter of on the order of 0.1 mm. The construction of wire 32 according to this embodiment is conventional in the art of superconducting wire. A commercially available example of stabilized superconducting wire suitable for use as wire 32 is SW Wire Type 18 wire available from Supercon, Inc.

According to this embodiment of the invention, thickness d of stabilizing material 34 is present between the external surface of wire 32 and the nearest one of strands 36 to the surface; this thickness d relates to the frequency at which high-frequency current generator 24 generates switching current, as will be described in detail hereinbelow. For the example where stabilizer 34 surrounds eighteen strands 36 of 0.1 mm diameter to form wire 32 having an overall diameter of 0.76 mm in diameter, a suitable distance d is approximately 0.04 mm.

Referring back to FIG. 3, persistent switch 25 is formed by bifilar winding of wire 32 about coil former 30, so that switch 25 is formed of a relatively long length of wire 32 (e.g., on the order of 100 meters for a 1 kA current). The bifilar winding of wire 32 is illustrated in FIG. 3. The bifilar winding of wire 32 in switch 25 is performed by folding wire 32 on itself, and then winding the folded wire 32 around coil former 30 to create multiple turns. Because of the bifilar winding, adjacent portions of wire 32 will carry current in opposite directions, as indicated by the current arrows of FIG. 3; the magnetic fields generated by adjacent portions of wire 32 thus tend to cancel one another out. As a result, wire 32 is non-inductively wound about coil former 30, such that the overall net inductance generated within persistent switch 25 is negligible. As will be described in further detail hereinbelow, the elimination of parasitic inductance from switch 25 is important, considering that the switching mechanism utilizes a current that is either at a high frequency or has a rapid rise time transient.

Persistent switch 25 is then preferably "potted" with a conventional electrically insulating material (not shown in FIG. 3), such as an epoxy, to provide structural and environmental protection for wire 32, and also to electrically insulate turns of wire 32 from each other. In particular, where switch 25 is formed of multiple overlying layers of wire 32 wound in bifilar fashion about coil former 30, switch 25 is preferably potted by vacuum impregnation of epoxy, so that epoxy potting material is injected to locations between adjacent turns of wire 32. The terminal ends of wire 32 will, of course, extend from switch 25 after such potting, for connection into the system.

Figure 5:
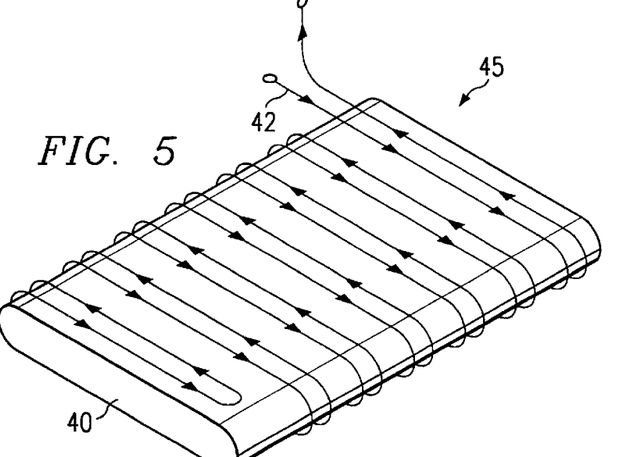
FIG. 5 is a perspective view of a persistent switch according to a second embodiment of the invention.

Of course, the persistent switch of the present invention may be formed according to other shapes. FIG. 5 illustrates persistent switch 45 according to a second embodiment of the invention. In this embodiment of the invention, coil former 40 is a relatively flat body of fiberglass/epoxy or other suitable electrically insulating material, about which stabilized superconducting wire 42 is wound in bifilar fashion. Coil former 40 preferably has rounded corners, as shown in FIG. 5, to prevent breaking of wire 42 as it is wound around coil former 40. Wire 42 is preferably constructed in a similar manner as wire 32 described hereinabove.

The construction of switch 45 according to this second embodiment of the invention may be preferred in many applications, as the cross-sectional area of each turn of wire is much reduced from that in switch 25 of FIG. 3. This reduction in the cross-sectional area of each turn of wire 42 is contemplated to reduce the localized inductance of individual turns of wire 42 within switch 45, considering that the inductance of a coil is directly proportional to the cross-sectional area of its turns. While the aggregate inductance of switches 25, 45 is quite low as measured at the terminal ends of wire 32, 42, respectively, parasitic inductance of the individual turns of wire 32, 42 will still be present. It is therefore contemplated that the structure of switch 45 of FIG. 5 will likely have less parasitic inductance, due to the reduced cross-sectional area of its turns. Again, as in the case of switch 25 of FIG. 3, switch 45 of FIG. 5 is preferably potted both overall and among its turns, for structural, environmental, and electrical stability.

Figure 6:
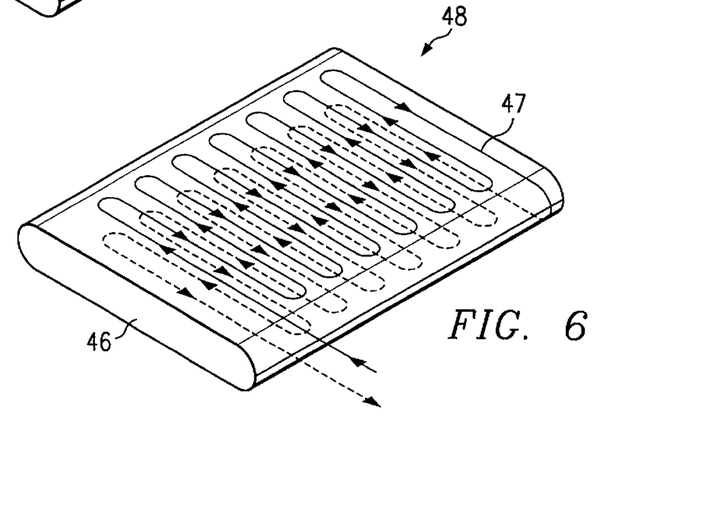
FIG. 6 is a perspective view of a persistent switch according to a third embodiment of the invention.

Referring now to FIG. 6, persistent switch 48 according to a third embodiment of the present invention will now be described. Persistent switch 48 includes coil former 46, which is a substantially flat body formed of fiberglass/epoxy or a similarly suitable electrical insulator. Superconducting wire 47, which is a stabilized superconductor formed similarly as wire 32 described hereinabove, is fixably attached to the major surfaces of coil former 46. As shown in FIG. 6, wire 47 is deployed in a meandering fashion on the major surfaces of coil former 46 (i.e., the top and bottom surfaces in the orientation shown in FIG. 6), with a single wraparound at the front edge of coil former 46 between the surfaces. Because wire 47 is not wound around coil former 46 in this embodiment of the invention, parasitic inductance is minimized. As in the case of switches 25 and 45, persistent switch 48 of FIG. 6 is preferably potted, for structural, environmental, and electrical stability.

Referring back to FIGS. 2 and 3, the operation of persistent switch 25 in energy storage system 20 according to a preferred embodiment of the invention will now be described; it is to be understood, of course, that switch 45 of FIG. 5 and switch 48 of FIG. 7 will operate similarly as switch 25.

The operation of energy storage system 20 will be described beginning with magnet 22 in its energized condition, with switch 25 closed. In this state, refrigeration system 26 has cooled cryostat 18 to superconducting temperatures, such as 5 kelvins or lower, and magnet 22 is conducting current, such as on the order of 1 kA, at a magnetic field suitable to maintain its superconducting state. Current generator 24 is off at this point, and as such only the DC current through magnet 22 is applied to switch 25. Switch 25 is in a superconducting state at this point, itself also being within cryostat 18, and thus appears as virtually zero resistance across leads 21a, 21b. The superconducting state of switch 25 thus permits it to conduct the entirety of the current conducted by magnet 22, and as such energy storage system 20 provides no current to power conditioning system 28 in this state.

According to this preferred embodiment of the invention, therefore, circulating current is not conducted outside of cryostat 18. As such, the entirety of the current conducted by magnet 22, and thus the current effecting the energy storage function of system 20, is maintained fully within cryostat 18, conducted only by superconducting material. Because no resistive losses are incurred by the circulating storage current, no trickle power supply need be implemented in system 20 according to the preferred embodiment of the invention. In addition, because the storage current is not conducted out of cryostat 18 during normal (i.e., non backup) operation, the size of leads 21a, 21b, particularly at the point of contact with cryostat 18, may be kept relatively small. The reduction in the size of the electrical conductors extending out of cryostat 18, enabled by energy storage system 20 according to the preferred embodiment of the invention, thus provides the additional advantage of reducing thermal losses from cryostat 18. The thermal load on refrigeration system 26 is therefore much reduced from that in conventional energy storage systems.

In the event that power conditioning system 28 undergoes a power loss (i.e., power ceases to be provided thereto on lines 23), controller 27 will detect the power loss by way of a signal on line SNS in the conventional manner for SMES systems. Controller 27 will, in turn, issue a switch signal on line SW to current generator 24 to initiate the switching action, by current generator 24 applying a rapid rise time current to leads 21a, 21b.

According to the present invention, at least two mechanisms are available by way of which current generated by current generator 24 directly heats the wire of persistent switch 25. The determination of which of these mechanisms is operative depends upon the frequency and duration of the applied current. According to the preferred embodiments of the invention, these two mechanisms involve the application of a high frequency periodic current, such as in the RF band, or alternatively the application of a current pulse of a lower frequency than the RF band; for purposes of this description, these two current types will be referred to generically as "rapid rise time" currents. Any of switches 25, 45, 48 may be switched according to either of these two mechanisms, as desired in the particular implementation. By way of example, the operation of persistent switch 25 according to these two contemplated mechanisms will now be described, it being understood that switches 45, 48 will operate in a similar manner.

A first one of these mechanisms utilizes the "skin effect", which refers to the physical mechanism of the attenuation of time-varying fields and currents in a conducting material. In materials of finite conductivity, electric field attenuation decays exponentially with distance from the surface of the conducting material, with an attenuation constant that varies with the square root of the frequency of the electric field (and associated current). The skin effect is used to advantage according to a first mechanism of the preferred embodiment of the invention, in which persistent switch 25 is switched from its superconducting state into a resistive state by the application of a high frequency current by current generator 24, as will now be described.

As described above, persistent switch 25 is constructed of wire 32 illustrated in cross-section in FIG. 4. Because of the skin effect, the bulk of the high frequency current generated by current generator 24 and received by switch 25 will be conducted by stabilizer 34 near the outer surface of wire 32. The frequency of the current generated by current generator 24 is preferably selected so that virtually all of the high frequency current is conducted within thickness d of the outer surface of wire 32, thus ensuring that no high frequency current is conducted by any of superconducting strands 36 (which would effectively shunt the high frequency current from stabilizer 34). In the above-described example of wire 32 that is 0.76 mm in diameter, with a desired thickness d of 0.04 mm, current generator 24 preferably applies a current of at least 5 to 10 MHz to ensure that conduction occurs fully within stabilizer 34.

As described hereinabove, stabilizer 34 is not superconducting material, but is instead a copper-nickel alloy, and as such the high frequency current conducted by stabilizer 34 results in resistive heating within wire 32. The resistive heating within stabilizer 34 is exacerbated by the high current density of the high-frequency current, considering that the effective cross-sectional area of conduction of the high-frequency current at the skin of wire 32 is quite small. The heat produced by this resistive heating is directly conducted to superconducting strands 36 within wire 32, considering that stabilizer 34 is a relatively good thermal conductor, and is in direct contact with strands 36 (i.e., with no thermal or electrical insulator disposed therebetween). This resistive heating of superconducting strands 36 causes the temperature of the superconducting material in wire 32 of persistent switch 25 to heat to a temperature above the critical temperature, normalizing the material into its resistive region.

According to a second mechanism, a transient current having a rise time that is rapid, but corresponding to frequencies below that at which the skin effect occurs, is applied by current generator 24 to persistent switch 25. Referring to the example of FIG. 4, according to this mechanism, conduction occurs not only in resistive stabilizer 34 of wire 32, but also in at least the outer ones of superconducting strands 36 of wire 32. As the applied rapid rise time current shifts into the superconducting strands 36 of wire 32, the conduction encounters "flux-flow" resistance which, as known in the field of wave physics, refers to the physical resistance encountered by a current distribution when the distribution changes. As is fundamental in the art, a magnetic field distribution is associated with any distribution of current density within a conducting medium; changes in a current density distribution will, in turn, change the corresponding magnetic field distribution. However, heat is produced as the magnetic field distribution changes, which may be visualized by the movement of magnetic flux lines through the crystalline lattice of the medium. Considering the example of wire 32, changes in the magnetic field distribution in superconducting strands 36 will directly "deposit" heat within strands 36; this heat can quickly raise the local temperature of strands 36 to above the critical temperature for superconductivity, normalizing persistent switch 25 into the resistive region.

Accordingly, according to either of the above-described mechanisms, rapid rise-time current is applied by current generator 24 to leads 21a, 21b. As illustrated in FIG. 2, magnet 22, power conditioning system 28, and switch 25 are all connected in parallel with one another at leads 21a, 21b. As described hereinabove, however, the inductance of switch 25 is maintained at a minimum by way of its construction, specifically due to its bifilar winding (in the example of switch 48 of FIG. 6, inductance is also minimized by the meandering wiring layout); this low inductance is in contrast to magnet 22 which, because of its construction as a magnet, has a very high inductance. Further, since wire 32 in switch 25 is initially in its superconducting state, the resistance of switch 25 is also very low. It is contemplated that the impedance of power conditioning system 28 will be substantial, given the nature of its components therein (specifically, the inverters, transformers, and the like presented to leads 21a, 21b). Accordingly, the impedance of switch 25 to the rapid rise time current generated by current generator 24 is very low, relative to magnet 22 and to power conditioning system 28 connected in parallel therewith. It is therefore contemplated that the rapid rise time current generated by current generator 24 will be conducted substantially exclusively by switch 25 in energy storage system 20 according to the preferred embodiment of the invention.

For the case of the periodic applied current, as noted above, the frequency of the current should be sufficiently high so as to be conducted substantially by stabilizer 34 of wire 32, and thus within outer thickness d of wire 34. The actual frequency of the current above this lower limit is preferably selected so that the resistive heating is as uniform as possible along the length of wire 32 in switch 25; such uniformity will improve the rate of change of normalization, by avoiding localized heating and thus avoiding localized quenching of superconductivity. To select this frequency, wire 32 should be considered as a distributed LC network, with the parasitic inductance of the wire considered along with the parasitic capacitance of adjacent lengths of wire 32; it is contemplated that one of ordinary skill in the art, through either empirical optimization or modeling, will be able to select an optimal frequency. In addition, the amplitude of current applied at the selected high frequency will, of course, dictate the switching speed.

In the case of the second mechanism, the rapid rise time current is applied by current generator 24 as a pulse, such as may be generated by the discharge of a capacitor through an inductor and into lines 21a, 21b. According to this mechanism, referring to the example of FIG. 4, the dominant frequency of the applied current pulse must be low enough so that significant conduction penetrates wire 32 through outer thickness d of stabilizing material 34, but still having a transient rise time sufficiently fast so that heat generated by flux-flow resistance is confined within the outer ones of superconducting strands 36, and does not diffuse outward into the surrounding environment.

In either case, it is contemplated that the various parameters of the rapid rise time current applied by current generator 24 may be readily optimized by one of ordinary skill in the art having reference to this specification, depending upon the parameters of the particular implementation.

Once current generator 24 applies the switching current to switch 25, resistive heating in wire 32 of switch 25 heats superconducting strands 36 in wire 32 to a temperature above the critical superconductivity temperature of the material of strands 36, at which time strands 36 normalize, and become resistive. It is contemplated that the time required for switch 25 to normalize is on the order of a thousandth of a second, for example 0.0005 to 0.002 seconds. The resistance of switch 25 then becomes substantial at this point in the operation, for example on the order of 20 Ω, which is larger than the impedance of power conditioning system 28 according to this embodiment of the invention. The current conducted by magnet 22 is then conducted substantially by power conditioning system 28, which in turn applies backup power to system load 29 for a sufficient duration (e.g., on the order of seconds) to permit a long-term backup power generation source, such as diesel generators, to apply power to system load 29.

The powering of magnet 22 may be performed in substantially the reverse sequence as the switching described hereinabove, beginning with the cooling of the interior of cryostat 18 by refrigeration system 26. Switch 25 is initiated into a non-superconducting state by the application of a rapid rise time current to leads 21a, 21b by power conditioning system 28. Switch 25 maintains itself in this resistive state, until the voltage across leads 21a, 21b falls to zero through operation of magnet 22. Circuitry in power conditioning system 28, or a separate power supply (not shown), applies DC current to leads 21a, 21b until the desired current magnitude is being conducted by magnet 22, in a superconducting state. At this point, current generator 24 is turned off, following which wire 32 in switch 25 will cool by the action of cryostat 18, and enter its superconducting state. Backup power protection of power conditioning system 28 by energy storage system 20 thus commences.

EXAMPLES

A low current example of the preferred embodiment of the present invention as actually implemented and tested, using the skin effect-based switching mechanism in response to a high-frequency (RF) switching current, will now be described, with reference to FIGS. 7a and 7b. This example of persistent switch 25 was fabricated having a circular cross-section such as illustrated in FIG. 3, of a diameter of 2.2 cm and length of 6 cm wound in bifilar fashion with 70 turns of copper-nickel stabilized wire of 0.762 mm diameter, with eighteen strands of 0.11 mm niobium titanium wire therewithin. This example of switch 25 was maintained at a temperature of 4.2 kelvins, with 95 amperes of DC current conducted therethrough.

Figure 7A:
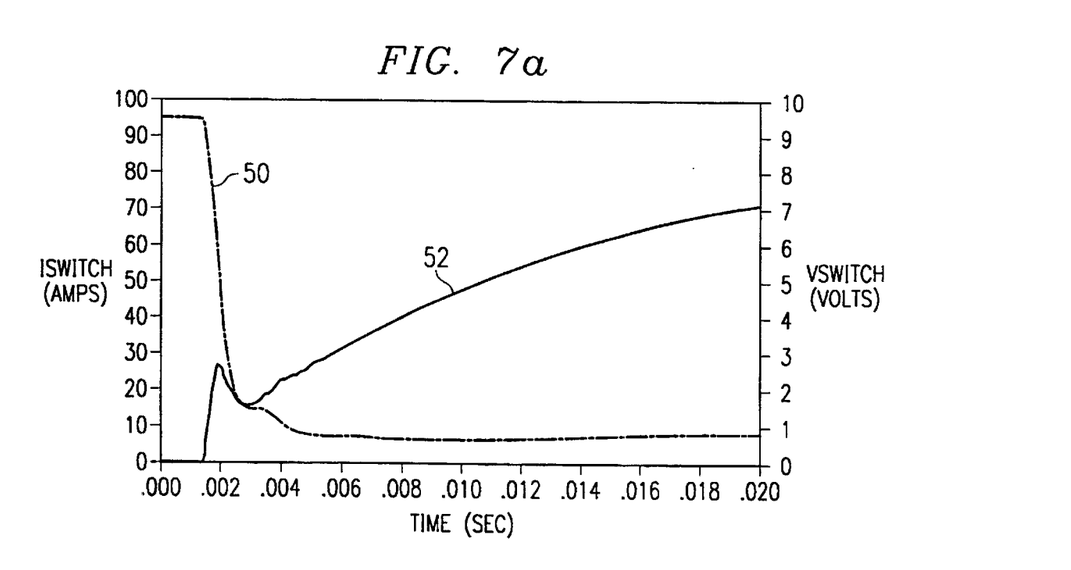
FIGS. 7a and 7b are plots illustrating the switching of an example of the persistent switch of FIG. 3.
Figure 7B:
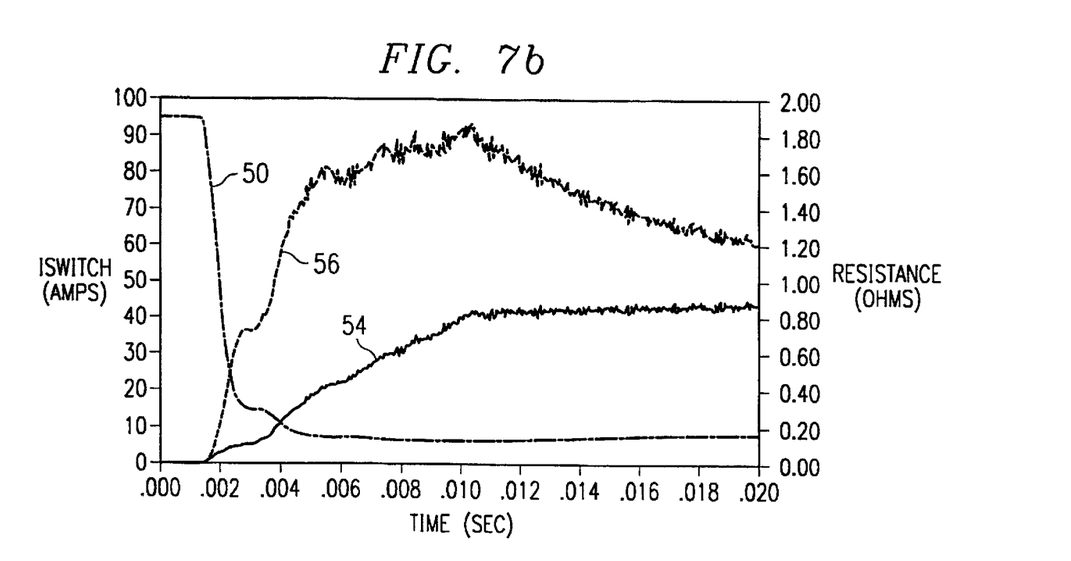

In FIG. 7a, current trace 50 and voltage trace 52 illustrate, prior to and at time zero, that exemplary switch 25 was conducting approximately 95 amperes with effectively zero volts thereacross. Referring to FIG. 7b, trace 54 plots the ratio of the voltage across exemplary switch 25 to the current therethrough, while trace 56 plots a calculated resistance for this exemplary switch 25 based upon the circuit equations for the implementation of this exemplary switch 25; at and before time zero, these resistances were effectively zero, as shown in FIG. 7b. At time zero in this example, a current of approximately 10 amperes at 20 MHz was applied to exemplary switch 25 to initiate normalization. As shown in FIGS. 7a and 7b, at approximately 1.5 msec after switching, the DC current through exemplary switch 25 began to drop (traces 50) and the voltage thereacross (trace 52) began to rise. Defining the switching time as the time required for the current to reduce to a factor of 1/e from its initial level, the switching time of this example of switch 25 is slightly over 2 msec. Specifically, the current through this exemplary switch 25 fell below 15 amperes at approximately 3.0 msec after switching, and fell below 10 amperes at approximately 4.0 msec. The asymptotic current level shown in traces 50 at between 7 and 9 amperes was, of course, dependent upon the relationship between external circuit impedances and the effective on-state resistance of exemplary switch 25.

Comparison of traces 54 and 56 to trace 50 illustrates that, in this exemplary switch 25, the bulk of the current was transferred out of exemplary switch 25 very quickly, at a point in time well prior to the onset of its full resistance. Accordingly, the performance of switch 25 according to the preferred embodiment of the present invention is sufficiently rapid to be useful in rapid response energy storage systems, such as that illustrated in FIG. 2. While the example of FIGS. 7a and 7b is directed to a relatively low current prototype, it is contemplated that similar behavior and response is readily attainable for high current applications such as the SMES system of FIG. 2.

Figure 8:
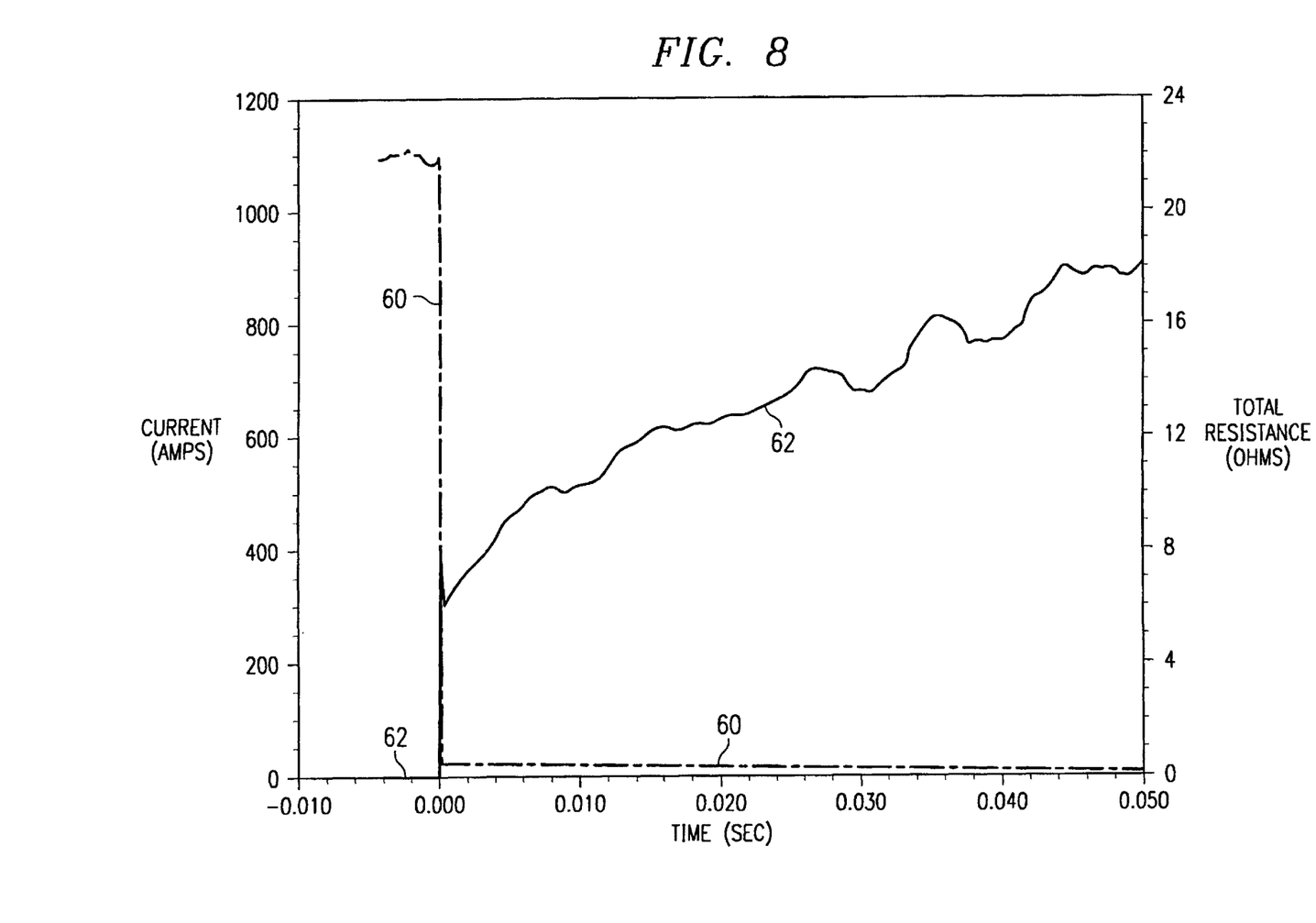
FIG. 8 is a plot illustrating the switching of an example of the persistent switch of FIG. 6.

Referring now to FIG. 8, the operation of the preferred embodiment of the invention according to the rapid rise time half-cycle pulse of current will now be described. The construction of the switch utilized in the example of FIG. 8 is according to the example of FIG. 6, in which coil former 46 of fiberglass/epoxy of dimensions 35 cm by 144 cm had 144 turns of copper-nickel stabilized wire of 0.762 mm diameter, with eighteen strands of 0.11 mm niobium titanium wire therewithin, deployed on its major surfaces as shown in FIG. 6. This example of switch 48 was maintained at a temperature of 4.2 Kelvins, with 1100 amperes of DC current conducted therethrough, as shown by curve 60 in the plot of FIG. 8 at times prior to 0.000 seconds. Curve 62 illustrates the resistance of switch 48, such resistance being essentially zero prior to 0.000 seconds.

At time zero, a current transient was applied to switch 48. In this example, this current transient was generated by a 480 $\mu$F capacitor initially charged to 170 volts, and discharged through a circuit which, together with switch 48 itself, had an effective series inductance of on the order of 50 $\mu$H. As evident from FIG. 8, the resistance of switch 48 becomes significant (at about 6 $\Omega$) within a few $\mu$sec of the application of the switching current at time zero, thereafter rising in a substantially linear fashion with time, reaching 18 $\Omega$ at about 0.050 sec. When deployed in an energy storage system, the current previously conducted by switch 48 will, of course, thus be rapidly directed to the system load by switch 48.

The preferred embodiments of the present invention is thus believed to provide important advantages in energy storage systems, as noted above. The persistent switch according to the preferred embodiments of the invention is rapidly normalized, primarily because of the close proximity between the superconducting material and the location of the resistive heat deposition due either to skin effect conduction or to flux-flow resistance, depending upon the current applied to the switch. Further, the present invention provides such a high speed persistent switch which may be included within the cryostat that also contains the storage magnet. This not only eliminates the need for non-superconducting conduction of the storage current, and thus for the makeup power supply required in conventional SMES systems, but also reduces thermal losses from the cryostat as the leads extending from the cryostat need not be of such a size as to support constant conduction of the high storage current. Accordingly, it is contemplated that the thermal load of the SMES system may also be minimized.

It is further contemplated that the persistent switch according to the present invention may be utilized to advantage in applications other than energy storage systems. For example, magnetic guns, electron guns, launchers, and the like require large amounts of current to be delivered in a very short duration pulse, as can be provided by the persistent switches described above relative to the preferred embodiments of the invention. Furthermore, the persistent switch according to the present invention is contemplated to be especially beneficial in gun and launcher applications which now typically incorporate single-use switches, considering that the switch according to the present invention is operable to provide rapid, high current, switching over many switching cycles.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An energy storage system, comprising:
   a cryostat;
   a electromagnet, comprised of superconducting material, disposed within the cryostat, and having first and second leads;
   a persistent switch, coupled to the first and second leads so as to be in parallel with the electromagnet, and comprising a length of wire having at least one strand of superconducting material and having electrically conductive stabilizer material in contact with the superconducting material; and
   a current generator, coupled to the first and second leads, for selectively applying a rapid rise time current to the persistent switch to normalize the switch into resistive operation.

2. The energy storage system of claim 1, wherein the current generator is for selectively applying a high frequency current to the persistent switch.

3. The energy storage system of claim 1, wherein the current generator is for selectively applying a current pulse to the persistent switch.

4. The energy storage system of claim 1, wherein the persistent switch is also disposed within the cryostat.

5. The energy storage system of claim 1, wherein the first and second leads are for coupling to a power conditioning system; and further comprising:
   a controller, having a sense input for receiving a sense signal from the power conditioning system indicating a loss of power therein, and coupled to the current generator, for initiating the current generator to apply the rapid rise time current responsive to receiving the sense signal.

6. The system of claim 1, wherein the persistent switch comprises:
   a length of wire having at least one strand of superconducting material and having electrically conductive stabilizer material in contact with the superconducting material and wound to form a coil, the wire having first and second ends connected to the first and second leads.

7. The system of claim 6, wherein the persistent switch further comprises:
   a coil former, about which the wire is wound in bifilar fashion.

8. The system of claim 7, wherein the coil former is in the shape of cylinder having a substantially circular cross-section.

9. The system of claim 7, wherein the coil former is in the shape of a flattened cylinder.

10. The system of claim 7, wherein the persistent switch further comprises:
    a coil former, having first and second major surfaces;
    wherein the wire is disposed in a meandering fashion at the first and second surfaces of the coil former.

11. The system of claim 1, wherein the wire comprises:
    a plurality of strands of superconducting material; and
    stabilizing material in contact with each of the plurality of strands of superconducting material, and extending to the surface of the wire.

12. The system of claim 11, wherein each of the strands of superconducting material within the wire are separated from the surface of the wire;
    and wherein a dominant frequency of the rapid rise time current is selected so that substantially all of the current is conducted by the stabilizing material of the wire.

13. The system of claim 11, wherein each of the strands of superconducting material within the wire are separated from the surface of the wire;
    and wherein the rise time of the rapid rise time current is selected so that the current density distribution in at least some of the superconducting strands changes so as to create flux-flow resistance.

14. A superconducting persistent switch, comprising:
    a length of wire having at least one strand of superconducting material and having electrically conductive stabilizer material in contact with the superconducting material and wound in bifilar fashion to form a coil, the wire having first and second ends for receiving a rapid rise time current.

15. The switch of claim 14, wherein the persistent switch further comprises:
    a coil former, about which the wire is wound in bifilar fashion.

16. The switch of claim 15, wherein the coil former is in the shape of cylinder having a substantially circular cross-section.

17. The switch of claim 15, wherein the coil former is in the shape of a flattened cylinder.

18. The switch of claim 14, wherein the wire comprises:
    a plurality of strands of superconducting material; and
    stabilizing material in contact with each of the plurality of strands of superconducting material, and extending to the surface of the wire.

19. The switch of claim 18, wherein each of the strands of superconducting material within the wire are separated from the surface of the wire so that substantially all of the rapid rise time current of a selected frequency will be conducted by the stabilizing material of the wire.

20. The switch of claim 18, wherein each of the strands of superconducting material within the wire are separated from the surface of the wire so that the current density distribution in at least some of the superconducting strands changes so as to create flux-flow resistance.

21. A superconducting persistent switch, comprising:
    a coil former, having first and second major surfaces; and
    a length of wire having at least one strand of superconducting material and having electrically conductive stabilizer material in contact with the superconducting material and disposed on the first and second major surfaces in a meandering fashion, the wire having first and second ends for receiving a rapid rise time current.

22. The switch of claim 21, wherein the coil former is in the shape of a flattened cylinder.

23. The switch of claim 21, wherein the wire comprises:
    a plurality of strands of superconducting material; and
    stabilizing material in contact with each of the plurality of strands of superconducting material, and extending to the surface of the wire.

24. The switch of claim 23, wherein each of the strands of superconducting material within the wire are separated from the surface of the wire so that substantially all of the rapid rise time current of a selected frequency will be conducted by the stabilizing material of the wire.

25. The switch of claim 23, wherein each of the strands of superconducting material within the wire are separated from the surface of the wire so that the current density distribution in at least some of the superconducting strands changes so as to create flux-flow resistance.

26. A method of operating a superconducting energy storage system, comprising the steps of:
    conducting current through a superconducting electromagnet and a superconducting persistent switch, the persistent switch comprising a length of wire having at least one strand of superconducting material and having electrically conductive stabilizer material in contact with the superconducting material, wherein first and second ends of the wire are coupled to a power conditioning system; and applying a rapid rise time switching current to the persistent switch, to normalize the superconducting material of the persistent switch to a resistive state.

27. The method of claim 26, wherein the applying step applies a current at a selected frequency so that substantially all of the applied current is conducted by the stabilizer material so as to normalize the superconducting material of the persistent switch to a resistive state.

28. The method of claim 26, wherein the persistent switch comprises a length of wire having a plurality of strands of superconducting material;

and wherein the applying step applies a current pulse having a rise time selected so that the current density distribution in at least some of the superconducting strands changes so as to create flux-flow resistance.

29. The method of claim 26, further comprising the step of:

prior to the conducting step, cooling a cryostat, within which the superconducting electromagnet and the persistent switch are contained, to a sufficiently low temperature so that the electromagnet and persistent switch are placed in a superconducting state.

30. The method of claim 26, wherein the superconducting electromagnet and the persistent switch are connected in parallel with one another;

and wherein the persistent switch is constructed in such a manner that its impedance to the current applied in the applying step is substantially less than the impedance of the superconducting electromagnet thereto.

31. The method of claim 26, further comprising the step of:

prior to the conducting step, cooling a cryostat, within which the superconducting electromagnet and the persistent switch are contained, to a sufficiently low temperature so that the electromagnet and persistent switch are placed in a superconducting state.

32. The method of claim 26, wherein the wire comprises:

a plurality of strands of superconducting material; and stabilizing material in contact with each of the plurality of strands of superconducting material, and extending to the surface of the wire to separate each of the plurality of strands of superconducting material from the surface of the wire by at least a threshold distance;

and wherein the applying step applies a current to the persistent switch at a frequency selected so that substantially all of the current is conducted by the portion of the stabilizing material at the surface of the wire and extending into the wire by the threshold distance.

33. The method of claim 26, wherein the wire comprises:

a plurality of strands of superconducting material; and stabilizing material in contact with each of the plurality of strands of superconducting material, and extending to the surface of the wire to separate each of the plurality of strands of superconducting material from the surface of the wire;

and wherein the applying step applies a current pulse having a rise time selected so that the current density distribution in at least some of the superconducting strands changes so as to create flux-flow resistance.

* * * * *